United States Patent
Yang et al.

(10) Patent No.: US 10,389,124 B2
(45) Date of Patent: Aug. 20, 2019

(54) POWER DISTRIBUTION PRIORITY CONTROLLER AND CONTROLLING METHOD OF A PHOTOVOLTAIC POWER GENERATION SYSTEM

(71) Applicant: Gree Electric Appliances, Inc. of Zhuhai, Guangdong (CN)

(72) Inventors: Du Yang, Guangdong (CN); Yuhai Su, Guangdong (CN); Guohua Jin, Guangdong (CN); Huanming Xiao, Guangdong (CN); Wencan Wang, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 186 days.

(21) Appl. No.: 15/511,060

(22) PCT Filed: Aug. 21, 2015

(86) PCT No.: PCT/CN2015/087847
§ 371 (c)(1),
(2) Date: Mar. 14, 2017

(87) PCT Pub. No.: WO2016/150091
PCT Pub. Date: Sep. 29, 2016

(65) Prior Publication Data
US 2017/0279272 A1  Sep. 28, 2017

(30) Foreign Application Priority Data
Mar. 24, 2015 (CN) .......................... 2015 1 0131049

(51) Int. Cl.
*H02J 3/14* (2006.01)
*H02J 7/35* (2006.01)
(Continued)

(52) U.S. Cl.
CPC .............. *H02J 3/14* (2013.01); *H01L 31/042* (2013.01); *H02J 3/383* (2013.01); *H02J 7/35* (2013.01); *H02J 13/0017* (2013.01); *H02S 50/00* (2013.01)

(58) Field of Classification Search
CPC .................. G06F 1/3203; G05B 15/02; G05B 2219/2642; G05B 2219/2639; G05B 23/0235
(Continued)

(56) References Cited

U.S. PATENT DOCUMENTS

2010/0017045 A1* 1/2010 Nesler .................... G06Q 10/06
                                                                   700/296
2013/0038122 A1  2/2013 Broniak et al.
(Continued)

FOREIGN PATENT DOCUMENTS

CN   103199564 A   7/2013
CN   103329161 A   9/2013
(Continued)

*Primary Examiner* — Michael J Brown
(74) *Attorney, Agent, or Firm* — The Webb Law Firm

(57) ABSTRACT

A power distribution priority controller and a controlling method of a photovoltaic power generation system. The controller includes a calculating unit configured to calculate an electric device priority list according to running state information of electric devices and photovoltaic power generation data and to determine a preferred power distribution schemes; a controlling unit configured to acquire in real time the running state information of all electric devices, and control the electric devices according to the preferred power distribution schemes determined by the calculating unit; a communicating unit configured to transmit the photovoltaic power generation data, the running state information of electric devices, and control command information; a storage unit configured to store, in time units, the photo-
(Continued)

```
┌─────────────────────────────────────────────┐
│ acquiring in real-time, by a controlling unit of a controller,  │  S1
│ running state information of all electric devices, and storing the │
│ information in a storage unit;                                     │
└─────────────────────────────────────────────┘
                      │
                      ▼
┌─────────────────────────────────────────────┐
│ calculating, by the calculating unit, an electric device priority │
│ list according to photovoltaic power generation data and the      │
│ running state information of electric devices, which are stored in │  S2
│ the storage unit, determining preferred power distribution        │
│ schemes, and storing the preferred power distribution schemes     │
│ in the storage unit;                                              │
└─────────────────────────────────────────────┘
                      │
                      ▼
┌─────────────────────────────────────────────┐
│ controlling, by the controlling unit, the electrical devices      │  S3
│ according to the preferred power distribution schemes stored in   │
│ the storage unit.                                                  │
└─────────────────────────────────────────────┘
``` voltaic power generation data, the running state information of electric devices, and the preferred power distribution schemes.

10 Claims, 1 Drawing Sheet

(51) Int. Cl.
*H02S 50/00* (2014.01)
*H01L 31/042* (2014.01)
*H02J 3/38* (2006.01)
*H02J 13/00* (2006.01)
*G05B 15/02* (2006.01)

(58) Field of Classification Search
USPC .................................. 700/286, 291, 295, 296
See application file for complete search history.

(56) References Cited

U.S. PATENT DOCUMENTS

| | | | |
|---|---|---|---|
| 2014/0074307 A1 | 3/2014 | Matsuyama et al. | |
| 2014/0371942 A1 | 12/2014 | Matsuyama et al. | |
| 2015/0214738 A1* | 7/2015 | Covic | H02J 3/32 |
| | | | 307/31 |
| 2016/0134109 A1 | 5/2016 | Kogo | |

FOREIGN PATENT DOCUMENTS

| | | |
|---|---|---|
| CN | 104037774 A | 9/2014 |
| CN | 104137384 A | 11/2014 |
| CN | 104734631 A | 6/2015 |
| DE | 202012102144 U1 | 9/2013 |
| WO | 2014185035 A1 | 11/2014 |

* cited by examiner

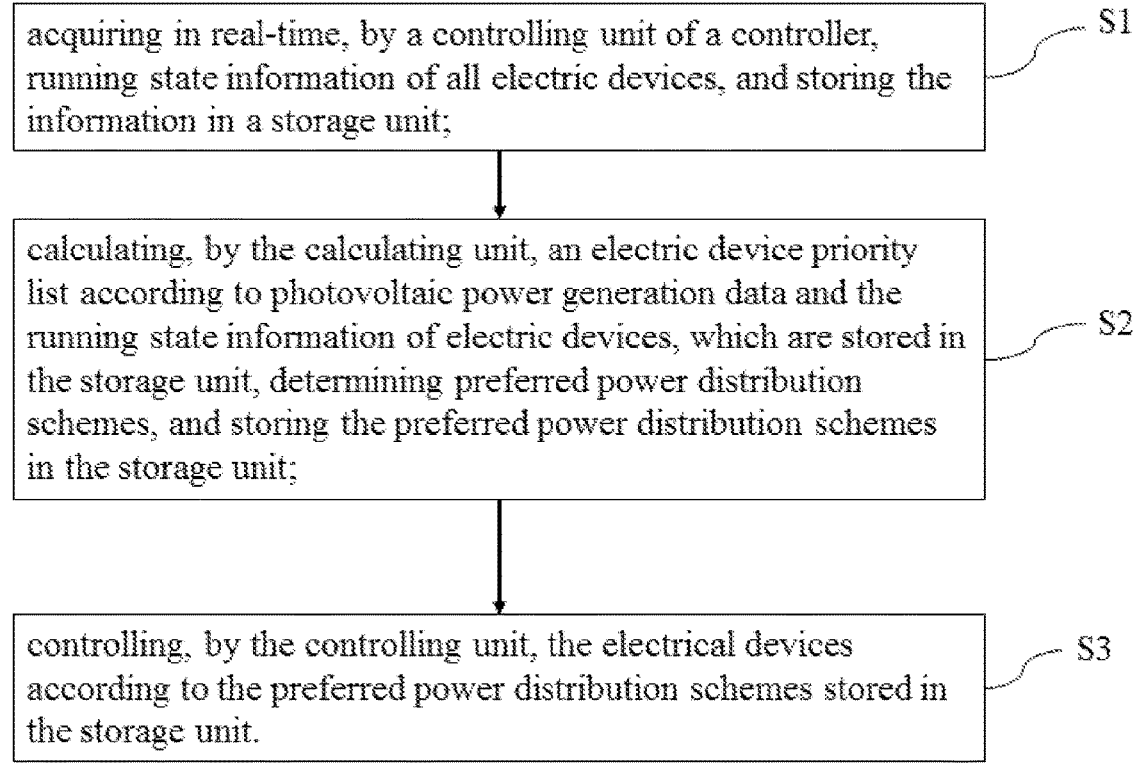

POWER DISTRIBUTION PRIORITY CONTROLLER AND CONTROLLING METHOD OF A PHOTOVOLTAIC POWER GENERATION SYSTEM

CROSS-REFERENCE TO RELATED APPLICATIONS

This application is the United States national phase of International Application No. PCT/CN2015/087847 filed Aug. 21, 2015, and claims priority to Chinese Patent Application No. 201510131049.5 filed Mar. 24, 2015, the disclosures of which are hereby incorporated in their entirety by reference.

FIELD OF THE INVENTION

Disclosed embodiments relate to photovoltaic power generation control, and more specifically to a power distribution priority controller of a photovoltaic power generation system and a controlling method applying the power distribution priority controller.

BACKGROUND OF THE INVENTION

With development of science, technologies, and economy, people's material living standards have been constantly improved, while their demands for energy also become increasingly high. However, due to gradual reduction of non-renewable energy resources (e.g., petroleum, coals), which also easily cause environmental pollution, people gradually use new energies such as solar energy and wind energy featuring renewability, cleanness, and pollution-free. In the field of electrical energy application, photovoltaic industry has been highly valued and developed. From aerospace power usage to home appliances, photovoltaic power supplies are ubiquitous.

However, during actual working processes, due to limits of photovoltaic panels, power generation, and costs, etc., as well as impacts of uncontrollable factors such as weather, it is inevitable that the photovoltaic power generation capacity is insufficient and cannot satisfy demands of electric devices, finally causing the electric devices unable to work normally.

In light of the above, an improved power distribution priority controller for a photovoltaic power generation system is needed to solve problems in the prior art related to insufficient photovoltaic power generation capacity that cannot meet the demands for power supply of electric devices.

SUMMARY OF THE INVENTION

An objective of the present disclosure is to provide a power distribution priority controller of a photovoltaic power generation system, which, in the case of insufficient photovoltaic power generation, meets electricity demands of necessary electric devices according to users' actual needs, so as to provide a more user-friendly option, thereby enhancing user experience and improving product competitiveness.

Another objective of the present disclosure is to provide a power distribution priority controlling method of a photovoltaic power generation system, which applies the power distribution priority controller of the photovoltaic power generation system as mentioned above.

The present disclosure provides a power distribution priority controller of a photovoltaic power generation system, and the controller comprising:

a calculating unit configured to calculate an electric device priority list based on running state information of electric devices and photovoltaic power generation data and to determine preferred power distribution schemes;

a controlling unit configured to acquire in real time the running state information of the electric devices, and control the electric devices according to the preferred power distribution schemes determined by the calculating unit;

a communicating unit configured to transmit the photovoltaic power generation data, running state information of electric devices, and control command information;

a storage unit configured to store, in association with time units, the photovoltaic power generation data, the running state information of electric devices, and the preferred power distribution schemes.

Optionally, the controller further comprises a displaying unit configured to display a list of electric devices, the running state information of the electric devices, and operation information of the user.

Optionally, the electric devices include refrigeration devices, heating devices and/or lighting devices.

Optionally, the preferred power distribution schemes include an air-conditioner preferred power distribution scheme, a refrigerator preferred power distribution scheme, a water heater preferred power distribution scheme, a lighting device preferred power distribution scheme, a bedroom equipment preferred power distribution scheme, a summer preferred power distribution scheme, a winter preferred power distribution scheme, and a customized power distribution scheme.

Optionally, the running state information of electric devices includes power consumption conditions of electric devices, and on/off state data of electric devices.

Optionally, the controller further comprises an intelligent preferred power distribution mode, such that when photovoltaic power capacity is insufficient, the controlling unit controls the electric devices according to an intelligent preferred power distribution scheme in which the priorities of the electric devices are arranged in a descending order.

The present disclosure further provides a power distribution priority controlling method of a photovoltaic power generation system, which applies the power distribution priority controller of the photovoltaic power generation system as mentioned above, the method comprising steps of:

S1: acquiring in real-time, by the controlling unit of the controller, running state information of all electric devices, and storing the running state information in the storage unit;

S2: calculating, by the calculating unit, an electric device priority list according to running state information of electric devices and photovoltaic power generation data, which are stored in the storage unit, determining a preferred power distribution schemes, and storing the preferred power distribution schemes in the storage unit; and S3: controlling, by the controlling unit, the electrical devices according to the preferred power distribution schemes stored in the storage unit.

Optionally, step S1 comprises: acquiring in real-time, by the controlling unit of the controller through the communicating unit, power consumption conditions and on/off state data of all electric devices, and storing them in the storage unit.

Optionally, step S2 specifically comprises: calculating, by the calculating unit, an electric device priority list according to power consumption conditions and on/off state data of electric devices, and photovoltaic power generation data, which are stored in the storage data, determining preferred power distribution schemes, and storing the preferred power distribution schemes in the storage unit.

Optionally, step S3 specifically comprises: controlling, by the controlling unit, on/off of the electric devices, mode conversion, and power distribution according to the preferred power distribution schemes stored in the storage unit.

The present disclosure has the following beneficial effects.

The present disclosure provides a power distribution priority controller of a photovoltaic power generation system, which comprises: a calculating unit configured to calculate an electric device priority list according to running state information of electric devices and photovoltaic power generation data and to determine a preferred power distribution schemes; a controlling unit configured to acquire in real time the running state information of all electric devices, and control the electric devices according to the preferred power distribution schemes determined by the calculating unit; a communicating unit configured to transmit the photovoltaic power generation data, the running state information of electric devices, and control command information; and a storage unit configured to store, in association with time units, the photovoltaic power generation data, the running state information of electric devices, and the preferred power distribution schemes.

The present disclosure further provides a power distribution priority controlling method of a photovoltaic power generation system, which applies the power distribution priority controller of the photovoltaic power generation system as mentioned above. The controller and controlling method of the present disclosure implement priority control and management of electric devices in the photovoltaic power generation system, which, in the case that the photovoltaic power is insufficient, meets electricity demands of necessary electric devices according to a user's actual needs, so as to provide a more user-friendly option, thereby enhancing user experience and improving product competitiveness.

BRIEF DESCRIPTION OF THE ACCOMPANYING DRAWINGS

FIG. 1 is a flow diagram of a power distribution priority controlling method of a photovoltaic power generation system according to a preferred embodiment of the present disclosure.

DETAILED DESCRIPTION OF THE PREFERRED EMBODIMENTS

In order to make technical problems being solved by the present disclosure, the adopted technical solution, and the achieved technical effect more apparent, technical solutions of embodiments of the present disclosure will be described in further detail with reference to the accompanying drawings. It is apparent that the embodiments as described are only part of the embodiments, rather than all of the embodiments of the present disclosure. Based on the embodiments in the present disclosure, all other embodiments obtained by those skilled in the art without exercise of inventive work fall within the protection scope of the present disclosure.

Disclosed embodiments provides a power distribution priority controller of a photovoltaic power generation system, comprising:

a calculating unit configured to calculate an electric device priority list according to running state information of electric devices and photovoltaic power generation data and to determine a preferred power distribution schemes;

a controlling unit configured to acquire in real time the running state information of all electric devices, and control the electric devices according to the preferred power distribution schemes determined by the calculating unit;

a communicating unit configured to transmit the photovoltaic power generation data, the running state information of electric devices, and control command information;

a storage unit configured to store, in association with time units, the photovoltaic power generation data, the running state information of electric devices, and the preferred power distribution schemes.

Preferably, the running state information of the electric devices includes: power consumption conditions and on/off state data of electric devices, e.g., real-time power consumption, power, and on/off conditions of the electric devices. The photovoltaic power generation data include power generation amount, output power, output voltage and other data of the photovoltaic cell.

The running state information of the electric devices and the photovoltaic power generation data can be associated with and/or stored in association with time data or time units indicating a time and/or time period at or during which the information and/or data was sensed, measured, determined, calculated, acquired, transmitted, and/or stored. Further, any other information or data disclosed herein, such as the control command information and the preferred power distribution schemes can be associated with and/or stored in association with time data or time units in a similar manner.

In the controller of the present embodiment, the calculating unit of calculates according to the real-time power consumption, the power and other data of electric devices received by the communicating unit, in conjunction with data information such as powers of the electric devices stored in the storage unit, determining whether the power supply of the photovoltaic power generation system is surplus or in shortage, and the controlling unit controls the electric devices according to the preferred power distribution schemes.

As an optional solution, the power distribution priority controller further comprises a displaying unit configured to display a list of electric devices, running state information of all electric devices, and operation information of the user.

Optionally, the electric devices include, but not limited thereto, refrigeration devices, heating devices and/or lighting devices; instead, the electric devices may also include other home appliances.

The controller presets different power distribution priorities for different electric devices. The default initial power distribution priority for electric devices may be arranged according to the ascending order of electric devices' power, namely the smaller the power of an electric device is, the higher the priority of the electric device is. Priorities of the electric devices may also be adjusted according to actual needs. Preferably, the preferred power distribution schemes determined by the controller in the present embodiment include an air-conditioner preferred power distribution scheme, a refrigerator preferred power distribution scheme, a water heater preferred power distribution scheme, a lighting device preferred power distribution scheme, a bedroom equipment preferred power distribution scheme, a summer preferred power distribution scheme, a winter preferred power distribution scheme, and a customized power distribution scheme. Preferred power distribution schemes illustrated above are available for the user to select, specifically:

(1) Air-conditioner preferred power distribution scheme: the air-conditioner is preset with the highest priority, and when the photovoltaic power capacity is insufficient, the photovoltaic power is preferably supplied to the air-conditioner;

(2) Refrigerator preferred power distribution scheme: the refrigerator is preset with the highest priority, and when the photovoltaic power capacity is insufficient, the photovoltaic power is preferably supplied to the refrigerator;

(3) Water heater preferred power distribution scheme: the water heater is preset with the highest priority, and when the photovoltaic power capacity is insufficient, the photovoltaic power is preferably supplied to the water heater;

(4) Lighting device preferred power distribution scheme: lighting devices are preset with the highest priority, and when the photovoltaic power capacity is insufficient, the photovoltaic power is preferably supplied to the lighting devices;

(5) Bedroom device preferred power distribution scheme: electric devices in the bedroom are preset with the highest priority, and priorities of these bedroom electric devices are arranged according to their power, then the ones among these bedroom electric devices with higher priority are prioritized in power supply;

(6) Summer preferred power distribution scheme: refrigeration devices such as air-conditioner and refrigerator are prioritized in power supply;

(7) Winter preferred power distribution scheme: heating devices such as floor heating and water heater are prioritized in power supply;

(8) Customized power distribution scheme: users may set priorities of different electric devices according to the actual needs based on displayed data information of the displaying unit.

As a preferred solution, the controller further comprises an intelligent preferred power distribution mode, such that when the photovoltaic power capacity is insufficient, the controlling unit controls the electric devices according to a preferred power distribution scheme in which the priorities are arranged in a descending order.

According to disclosed embodiments, priorities in the intelligent preferred power distribution scheme can be determined in the following manner:

1. The controller records in real time the information such as on/off and power consumption conditions of respective electric devices and stores the information in the storage unit.

2. When the photovoltaic power capacity is insufficient, the controller retrieves, with the current time as reference, data information including a list of electric devices, their on/off states, power consumption and lasting time, in T1 time interval before and after the time point within a preceding period T, which are stored in the storage unit (wherein T denotes a sampling period, e.g., 1 month; T1 is a reference time for determining a priority, e.g., 30 minutes).

3. The calculating unit of the controller calculates an electric device priority list according to the equation below and determines a preferred power distribution scheme according to priorities in a descending order.

$$PRI = \frac{1}{T}\sum_{n=0}^{T}(T_1 t_d) + \frac{p_d}{P_s} + \sigma$$

Wherein: PRI denotes the power distribution priority of an electric device, and the smaller the PRI value is, the higher the priority of the electric device is;

T denotes a sampling period, e.g., 1 month;

T1 denotes a reference time for determining a priority, e.g., 30 minutes;

td is the duration of using the electric device within T1 time in the T period every day;

pd is the maximum power of the electric device;

ps is the maximum power supply of the current photovoltaic power generation system;

σ is a time priority coefficient. Within the T1 time period, the closer the time of using the electric device is to the current time, the smaller the σ is.

4. The controlling unit of the controller performs a collective management and control of the on/off, mode conversion, and power distribution of the electric devices according to the intelligent preferred power distribution scheme as determined above.

Disclosed embodiments also provide a power distribution priority controlling method of a photovoltaic power generation system, which applies the power distribution priority controller of the photovoltaic power generation system as mentioned above, with a flow shown in FIG. 1, comprising steps of:

S1: acquiring in real-time, by the controlling unit of the controller, running state information of all electric devices, and storing the running state information in the storage unit.

According to disclosed embodiments, preferably, step S1 specifically comprises: acquiring in real-time, by the controlling unit of the controller through the communicating unit, power consumption conditions and on/off state data of all electric devices, and storing them in the storage unit.

step S2: calculating, by the calculating unit, an electric device priority list according to running state information of electric devices and photovoltaic power generation data, which are stored in the storage unit, and determining preferred power distribution schemes, then storing the preferred power distribution schemes in the storage unit.

According to disclosed embodiments, preferably, step S2 specifically comprises: calculating, by the calculating unit, an electric device priority list according to photovoltaic power generation data, power consumption conditions of electric devices, and on/off state data of electric devices, which are stored in the storage data, and determining preferred power distribution schemes, then storing the preferred power distribution schemes in the storage unit. A preferred power distribution scheme has been illustrated as above, so it's not repeated here.

step S3: controlling, by the controlling unit, the electrical devices according to the preferred power distribution scheme stored in the storage unit.

According to disclosed embodiments, step S3 specifically comprises: controlling, by the controlling unit, on/off, mode conversion, and power distribution of the electric devices according to the preferred power distribution schemes stored in the storage unit.

The present disclosure implements priority control and management of electric devices in the photovoltaic power generation system, which, in the case of insufficient photovoltaic power generation, satisfies use demands of necessary electric devices according to a user's actual needs, so as to provide a more user-friendly option, thereby enhancing user experience and improving product competitiveness.

What have been discussed above are only preferred embodiments of the present disclosure, not for limiting the present disclosure. For those skilled in the art, the present disclosure may have various changes and variations. Any modification, equivalent replacement, improvement within the principle and spirit of the present disclosure should be included within the protection scope of the present disclosure.

The invention claimed is:

1. A power distribution priority controller of a photovoltaic power generation system, comprising:
   a calculating unit configured to calculate an electric device priority list based on running state information of electric devices and photovoltaic power generation data, and to determine preferred power distribution schemes;
   a controlling unit configured to acquire in real time the running state information of the electric devices, and control the electric devices according to the preferred power distribution schemes determined by the calculating unit;
   a communicating unit configured to transmit the photovoltaic power generation data, the running state information of the electric devices, and control command information; and
   a storage unit configured to store, in association with time units, the photovoltaic power generation data, the running state information of the electric devices, and the preferred power distribution schemes, wherein
   the running state information of the electric devices includes power consumption conditions and on/off state data of the electric devices, the power consumption conditions including real-time power consumption and power, and
   the photovoltaic power generation data includes power generation amount, output power, and output voltage data;
   wherein the electric device priority list is calculated according to the equation below, and an intelligent preferred power distribution scheme is determined according to priorities of the electric devices in a descending order:

$$PRI = \frac{1}{T}\sum_{n=0}^{T}(T_1 t_d) + \frac{p_d}{P_s} + \sigma$$

wherein PRI denotes a power distribution priority of an electric device, and the smaller the PRI value is, the higher the priority of the electric device is;
   T denotes a sampling period;
   $T_1$ denotes a reference time for determining a priority;
   $t_d$ is a duration of using the electric device within $T_1$ time in the T period every day;
   $p_d$ is a maximum power of the electric device;
   $p_s$ is a maximum power supply of a current photovoltaic power generation system; and
   σ is a time priority coefficient, within the $T_1$ time period, wherein the closer a time of using the electric device is to a current time, the smaller the σ is.

2. The power distribution priority controller of a photovoltaic power generation system according to claim 1, wherein the controller further comprises a displaying unit configured to display a list of the electric devices, the running state information of the electric devices, and user's operation information.

3. The power distribution priority controller of a photovoltaic power generation system according to claim 1, wherein the electric devices comprise refrigeration devices, heating devices and/or lighting devices.

4. The power distribution priority controller of a photovoltaic power generation system according to claim 1, wherein the preferred power distribution schemes comprise an air-conditioner preferred power distribution scheme, a refrigerator preferred power distribution scheme, a water heater preferred power distribution scheme, a lighting device preferred power distribution scheme, a bedroom equipment preferred power distribution scheme, a summer preferred power distribution scheme, a winter preferred power distribution scheme, and a customized power distribution scheme.

5. The power distribution priority controller of a photovoltaic power generation system according to claim 1, wherein the power distribution priority controller further has an intelligent preferred power distribution mode, wherein when photovoltaic power capacity is insufficient, the controlling unit controls the electric devices according to the intelligent preferred power distribution scheme in which the priorities of the electric devices are arranged in a descending order.

6. A power distribution priority controlling method of a photovoltaic power generation system, comprising:
   acquiring in real-time, by a controlling unit of a power distribution priority controller, running state information of electric devices, and storing the running state information in a storage unit;
   calculating, by a calculating unit, an electric device priority list based on the running state information of the electric devices and photovoltaic power generation data, which are stored in the storage unit, determining preferred power distribution schemes, and storing the preferred power distribution schemes in the storage unit; and
   controlling, by the controlling unit, the electrical devices according to the preferred power distribution schemes stored in the storage unit;
   wherein the electric device priority list is calculated according to the equation below, and an intelligent preferred power distribution scheme is determined according to priorities of the electric devices in the descending order:

$$PRI = \frac{1}{T}\sum_{n=0}^{T}(T_1 t_d) + \frac{p_d}{P_s} + \sigma$$

wherein PRI denotes a power distribution priority of an electric device, and the smaller the PRI value is, the higher the priority of the electric device is;
   T denotes a sampling period;
   $T_1$ denotes a reference time for determining a priority;
   $t_d$ is a duration of using the electric device within $T_1$ time in the T period every day;
   $p_d$ is a maximum power of the electric device;
   $p_s$ is a maximum power supply of a current photovoltaic power generation system; and
   σ is a time priority coefficient, within the $T_1$ time period, wherein the closer a time of using the electric device is to a current time, the smaller the σ is.

7. The power distribution priority controlling method of a photovoltaic power generation system according to claim 6, further comprising acquiring in real-time, by the controlling unit of the controller through a communicating unit, power consumption conditions and on/off state data of the electric devices, and storing the power consumption conditions and on/off state data in the storage unit.

8. The power distribution priority controlling method of a photovoltaic power generation system according to claim 7, further comprising calculating, by the calculating unit, an electric device priority list according to the power consumption conditions, the on/off state data of the electric devices and the photovoltaic power generation data, which are stored in the storage data, determining preferred power distribution schemes, and storing the preferred power distribution schemes in the storage unit.

9. The power distribution priority controlling method of a photovoltaic power generation system according to claim 6, further comprising controlling, by the controlling unit, on/off, mode conversion and power distribution of the electric devices according to the preferred power distribution schemes stored in the storage unit.

10. The power distribution priority controlling method of a photovoltaic power generation system according to claim 6, wherein when the photovoltaic power capacity is insufficient, controlling, by the controlling unit, the electrical devices according to the intelligent preferred power distribution scheme, stored in the storage unit, in which the priorities are arranged in a descending order.

* * * * *